(12) United States Patent
Kachi et al.

(10) Patent No.: US 7,211,839 B2
(45) Date of Patent: May 1, 2007

(54) GROUP III NITRIDE SEMICONDUCTOR DEVICE

(75) Inventors: Tetsu Kachi, Nisshin (JP); Yoshitaka Nakano, Owariasahi (JP); Tsutomu Uesugi, Seto (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 174 days.

(21) Appl. No.: 10/771,528

(22) Filed: Feb. 5, 2004

(65) Prior Publication Data

US 2004/0157355 A1     Aug. 12, 2004

(30) Foreign Application Priority Data

Feb. 6, 2003  (JP) ............................. 2003-029374
Jan. 8, 2004  (JP) ............................. 2004-003368

(51) Int. Cl.
   *H01L 29/793*   (2006.01)
(52) U.S. Cl. ....................... 257/194; 257/183
(58) Field of Classification Search ............. 257/183, 257/188, 189
   See application file for complete search history.

(56) References Cited

U.S. PATENT DOCUMENTS 6,933,544 B2 *  8/2005  Saito et al. ................. 257/194

FOREIGN PATENT DOCUMENTS

JP    10-223901    8/1998

\* cited by examiner

*Primary Examiner*—Bradley K. Smith
(74) *Attorney, Agent, or Firm*—Oblon, Spivak, McClelland, Maier & Neustadt, P.C.

(57) ABSTRACT

A semiconductor device is formed by a first layer 32 composed of AlGaN, a second layer 42 composed of GaN, a gate electrode 34, a source electrode 38, and a drain electrode 28. The first layer 32 has a region 32a formed between the gate electrode 34 and the second layer 42. A channel is formed in the vicinity of the boundary 24 of the first layer 32 and the second layer 42. The second layer 42 has p-type conductivity and is in contact with the source electrode 38.

When electrons flow in the channel, the electrons collide with surrounding atoms, and holes are formed. If holes are accumulated inside the semiconductor device, the presence of the accumulated holes causes dielectric breakdown. In the semiconductor device of the invention, holes are discharged to the outside of the device thorough the second layer 42 and the source electrode 38, and accumulation of holes can be prevented.

22 Claims, 7 Drawing Sheets

GROUP III NITRIDE SEMICONDUCTOR DEVICE

CROSS-REFERENCE TO RELATED APPLICATIONS

The present application claims priority on Japanese Patent application 2004-003368 filed on Jan. 8, 2004 which claims priority on Japanese Patent application 2003-029374 filed on Feb. 6, 2003, the contents of these applications are hereby incorporated by reference within this specification.

1. Field of the Invention

The present invention relates to a semiconductor device comprising a group III nitride semiconductor.

2. Description of the Related Art

Japanese unexamined patent application publication No. 10-223901 discloses a semiconductor device comprising a group III nitride semiconductor. More specifically, it discloses a field-effect transistor in which a buffer layer, a channel layer, and a gate-insulating layer are stacked successively on a substrate, and a gate electrode is formed thereupon. The channel layer is composed of an n-type GaN (gallium nitride, a group III nitride semiconductor).

When the above-described semiconductor device is switched ON, electrons flow in the channel layer. When electrons flow in the channel layer, the electrons collide with surrounding atoms, and holes are formed. If the quantity of electrons flowing in the channel layer is increased, the quantity of the holes formed in the channel layer is also increased. Those holes are accumulated inside the semiconductor device. The presence of the accumulated holes causes dielectric breakdown of the semiconductor device. In the above-described semiconductor device, this was the factor hindering the realization of increased voltage resistance.

Another problem with such a semiconductor device is rather high ON resistance. In the above-mentioned prior art, it is explained that reducing the concentration of carriers in the channel layer of the above-described transistor enables a normally-off structure. In the normally-off structure in this specification, the device is OFF (substantially no current flows in the device) while no voltage is applied to the gate electrode of the transistor. However, with such a semiconductor device having normally-off structure, the ON resistance becomes high due to low concentration of carriers in the channel layer. The prior art fails to realize a normally-off semiconductor device having a decreased ON resistance. Thus, there is a necessity of realizing a normally-off semiconductor device by a method different from that of realizing a normally-off structure by decreasing the concentration of carriers in the channel layer.

SUMMARY OF THE INVENTION

It is an object of the present invention to increase the voltage resistance of a semiconductor device comprising a group III nitride semiconductor.

It is another object of the present invention to decrease the ON resistance of a semiconductor device comprising a group III nitride semiconductor.

It is yet another object of the present invention to obtain a novel structure realizing a normally-off semiconductor device comprising a group III nitride semiconductor.

The present invention attains at least one of the above-described objects.

One example of a semiconductor device embodying the present invention comprises a first layer composed of a group III nitride semiconductor, a second layer composed of a group III nitride semiconductor, and a gate electrode. The first layer has a region formed between the gate electrode and the second layer. The conductivity type of the second layer is inversed with respect to the conductivity type of the carriers flowing in a channel. In this semiconductor device, the channel is formed in at least one of: (1) the first layer, (2) the second layer, (3) the boundary region between the first layer and the second layer.

If the carriers flowing in the channel collide with surrounding atoms, then carriers with the conductivity type inversed with respect to that of the carriers flowing in the channel are formed. With the above-described semiconductor device, those carriers of the inversed conductivity type can be pulled out from the channel by using the second layer with the conductivity type inverted with respect to the conductivity type of the carriers flowing in the channel. As a result, accumulation of the carriers of the inversed conductivity type in the semiconductor device can be suppressed. Therefore, the occurrence of dielectric breakdown caused by the presence of accumulated carriers of the inversed conductivity type can be suppressed and voltage resistance can be increased.

In one example of a semiconductor device embodying the present invention, the second layer is preferably in contact with an electrode for leading out the carriers with the conductivity type inversed with respect to that of the carriers flowing in the channel from the semiconductor device. More specifically, the second layer is preferably in contact with either a source electrode or a drain electrode. When the second layer has p-type conductivity, the second layer is preferably in contact with the source electrode.

With the above-described example, the carriers with the conductivity type inversed with respect to that of the carriers flowing in the channel can be effectively pulled out from the channel through the second layer.

Another example of a semiconductor device embodying the present invention comprises a first layer composed of a group III nitride semiconductor of a first conductivity type, a second layer composed of a group III nitride semiconductor of a second conductivity type, and a gate electrode. The first layer has a region formed between the gate electrode and the second layer, and the first layer and the second layer are in contact with each other. The band gap of the first layer is larger than the band gap of the second layer.

With the above-described semiconductor device, a quantum well functioning as a channel can be formed in the vicinity of the boundary between the first layer and the second layer. As a result, the collection degree of the carriers can be increased. This enables the channel resistance to be decreased. As a consequence, the ON resistance can be decreased.

The first layer preferably contains Al (aluminum). In this case, the band gap of the first layer can be increased. The second layer preferably contains In (indium). In this case, the band gap of the second layer can be decreased.

Yet another example of a semiconductor device embodying the present invention comprises a first layer composed of a group III nitride semiconductor of a first conductivity type, a second layer composed of a group III nitride semiconductor of a second conductivity type, a third layer composed of a group III nitride semiconductor of the first conductivity type, and a gate electrode. The first layer has a region formed between the gate electrode and the second layer. The third layer has a region formed between the first layer and the second layer. The band gap of the third layer is less than the band gap of the first layer.

With the above-described semiconductor device, a quantum well functioning as a channel can be formed within the third layer at the first layer side. Therefore, the ON resistance can be decreased.

Yet another example of a semiconductor device embodying the present invention comprises a first layer composed of a group III nitride semiconductor of a first conductivity type, a second layer composed of a group III nitride semiconductor of a second conductivity type, a third layer composed of a group III nitride semiconductor, and a gate electrode. The first layer has a region formed between the gate electrode and the second layer. The third layer has a region formed between the first layer and the second layer. The band gap of the third layer is less than the band gap of the first layer and the second layer. The conductivity type of the third layer may be either the first conductivity type or the second conductivity type.

With the above-described semiconductor device, a quantum well functioning as a channel can be formed in the third layer. Therefore, in this case, too, the ON resistance can be decreased.

The third layer is preferably composed of a substantially impurity free group III nitride semiconductor (true group III nitride semiconductor). The true III nitride semiconductor may be obtained by epitaxial growth method without introducing dopant.

With this configuration, the occurrence of the carriers' diffusion by dopant may be prevented when the carriers flow in the third layer. Therefore, the mobility of the carriers in the channel can be increased. As a result, the ON resistance can be decreased.

Yet another example of a semiconductor device embodying the present invention comprises a first layer composed of a group III nitride semiconductor of a first conductivity type, a second layer composed of a group III nitride semiconductor of a second conductivity type, and a gate electrode. The first layer has a region formed between the gate electrode and the second layer. The thickness of the first layer is not more than the thickness of a depleted layer that will extend from a boundary between the first layer and the second layer to the first layer side when no electric voltage is applied to the gate electrode.

With this embodiment, a semiconductor device having a normally off structure can be realized.

The concentration of carriers in the first layer is preferably $1 \times 10^{17}$ cm$^{-3}$ or less, and the concentration of carriers in the second layer is preferably $1 \times 10^{17}$ cm$^{-3}$ or more. With this configuration, a semiconductor device that can be normally off can be readily realized.

The gate electrode may be in direct contact with the first layer. The gate electrode may be adjacent to the first layer via a gate-insulating layer. The gate-insulating layer preferably contains a group III nitride semiconductor containing at least Al (aluminum as the group III element). Providing such a gate-insulating layer makes it possible to increase the voltage, which can be applied to the gate electrode.

The gate electrode is preferably of a trench type.

In this case, the channel is formed along the side surface of the trench-type gate electrode. When the trench-type gate electrode extending in a direction perpendicular to a surface of the semiconductor substrate is formed, a channel extending in the direction perpendicular to the surface of the semiconductor substrate can be formed. Therefore, the surface area of the semiconductor device can be decreased. This is effective for the integration of the semiconductor device.

The drain electrode and source electrode are preferably formed on the same surface side of the semiconductor device containing the first layer and the second layer. Alternatively, the source electrode may be formed on a first surface side of the semiconductor device containing the first layer and the second layer, and the drain electrode may be formed on a second surface, which is on the opposite side.

The present invention can be applied to transistors. A transistor employing the present invention comprises a gate electrode, a first layer composed of a group III nitride semiconductor of a first conductivity type, and a second layer composed of a group III nitride semiconductor of a second conductivity type, which is located on a side of the first layer that is opposite to the gate electrode. This transistor functions as a field-effect transistor.

In this transistor, when the carriers flow in the first layer of the first conductivity type and the carriers collide with atoms, thereby producing carriers of the inversed conductivity type, the produced carriers of the inversed conductivity type move into the second layer of the second conductivity type. Thus, the carriers of the inversed conductivity type do not accumulate in the first layer of the first conductivity type. With such a transistor, the occurrence of breakdown of the transistor caused by the accumulation of the carriers of the inversed conductivity type can be prevented.

The first layer and the second layer may be in direct contact with each other. In this case, the band gap of the first layer is preferably larger than the band gap of the second layer. In this case, the collection degree of the carriers in the vicinity of the interface of the first layer and the second layer increases and the ON resistance decreases.

Alternatively, a third layer having a band gap less than the band gaps of the first layer and the second layer may be located between the first layer and the second layer. In this case, the collection degree of the carriers in the third layer increases and the ON resistance decreases.

If the third layer is composed of a true group III nitride semiconductor, the carrier mobility increases and the ON resistance decreases.

A third layer composed of a group III nitride semiconductor of the first conductivity type and having a band gap less than the band gap of the first layer may be positioned between the first layer and the second layer. In this case the carrier collection degree in the vicinity of the interface of the first layer and the third layer increases and the ON resistance decreases.

In the transistor in accordance with the present invention a depleted layer expands from the second layer toward the first layer when no electric voltage is applied to the gate electrode. The position and thickness of the first layer is preferably selected so that the depleted layer expanding from the second layer toward the first layer may deplete the entire first layer.

This transistor operates in a normally-off mode.

When the position and thickness of the first layer has been selected so as to deplete the entire first layer, a gate insulating film may be disposed between the gate electrode and the first layer.

If a gate insulating film is disposed between the gate electrode and the first layer, a sufficiently high voltage can be applied to the gate electrode, allowing for a large-current ON/OFF switching.

In accordance with the present invention, the voltage resistance of the semiconductor device comprising the group III nitride semiconductor can be increased. Alternatively, the ON resistance of the semiconductor device comprising the group III nitride semiconductor can be decreased. Furthermore, a novel structure of a normally-off semiconductor device comprising the group III nitride semiconductor can be realized. The present invention can provide a semiconductor device realizing at least one of the above objects.

DESCRIPTION OF THE PREFERRED EMBODIMENTS

The preferred aspects of the present invention will be described below.

(First Preferred Aspect)

The semiconductor device of this aspect comprises a fourth layer composed of a group III nitride semiconductor of the first conductivity type, a second layer formed on the fourth layer and composed of a group III nitride semiconductor of a second conductivity type, a first layer composed of a group III nitride semiconductor of a first conductivity type and formed on the second layer directly or via a third layer composed of a group III nitride semiconductor, a gate electrode formed on the first layer directly or via a gate insulating layer, a source electrode which is in contact with one end side of the first layer directly or via a source layer of the first conductivity type, and a drain electrode which is in contact with the other end side of the first layer directly or via a drain layer of the first conductivity type.

(Second Preferred Aspect)

The semiconductor device of this aspect comprises a fourth layer composed of a group III nitride semiconductor of a first conductivity type, a drain electrode formed on a first surface of the fourth layer, a second layer composed of a group III nitride semiconductor of a second conductivity type and formed on a second surface of the fourth layer, the first surface and the second surface being opposite with respect to the fourth layer, a first layer composed of a group III nitride semiconductor of the first conductivity type and formed on the second layer directly or via a third layer composed of a group III nitride semiconductor, a gate electrode formed on the first layer directly or via a gate insulating layer, and a source electrode which is in contact with one end side of the first layer directly or via a source layer of the first conductivity type. The second layer is divided into a plurality of regions, and the fourth and first layers or the fourth and third layers make direct contact at those divisions.

(Third Preferred Aspect)

A third layer of the third embodiment is composed of a true group III nitride semiconductor not doped with dopant, or a group III nitride semiconductor doped with dopant of a first conductivity type.

Each embodiment will be described below in greater detail with reference to the appended drawings.

(First Embodiment)

Figure 1:
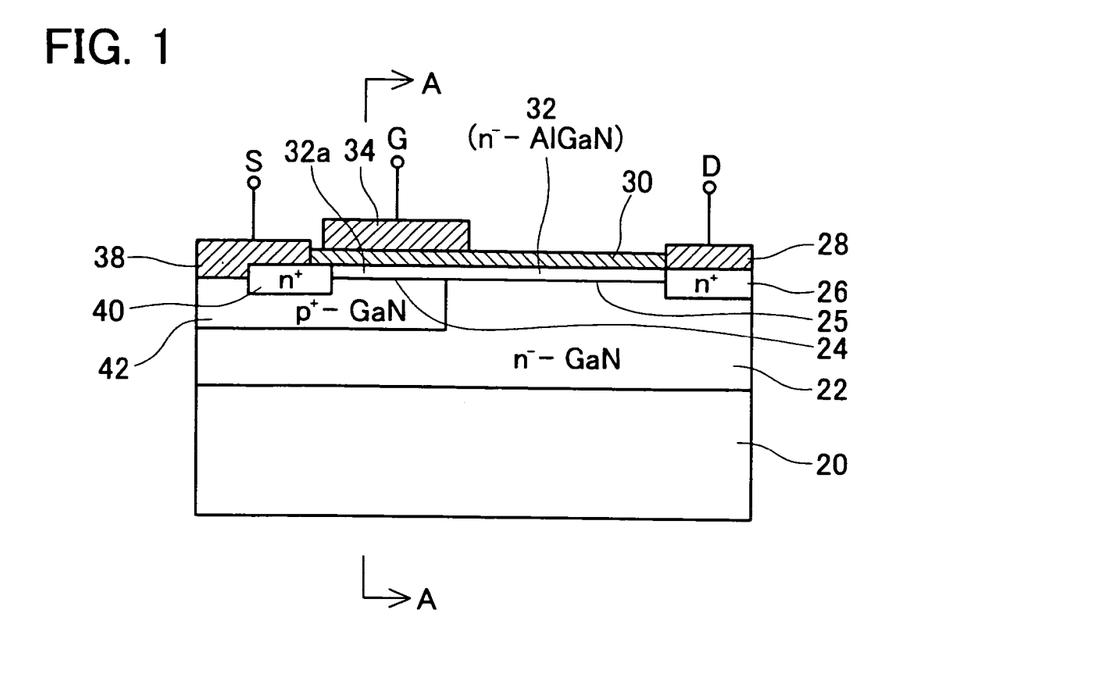
FIG. 1 is a cross-sectional view of the field-effect transistor of the first embodiment.

FIG. 1 is a cross sectional view of a field-effect transistor of the first embodiment. In this transistor, a lower $n^-$-type layer (fourth layer) 22 is formed on a substrate 20. The substrate 20 is composed of $Al_2O_3$ (sapphire). The lower $n^-$-type layer 22 is composed of GaN (gallium nitride) doped with Si (silicon), which is an n-type dopant. The concentration of carriers in the lower $n^-$-type layer 22 is about $1 \times 10^{16}$ $cm^{-3}$. The thickness of the thickest portion of the lower $n^-$-type layer 22 is about 5 µm. A $p^+$-type layer (second layer) 42 is formed on the region, which is part of the lower $n^-$-type layer 22. The $p^+$-type layer 42 is composed of GaN doped with Mg (magnesium which is a p-type dopant). The concentration of carriers in the $p^+$-type layer 42 is about $1 \times 10^{18}$ $cm^{-3}$. The thickness of the thickest portion of the $p^+$-type layer 42 is about 0.5 µm. Ge (germanium) or the like may be also doped as the n-type dopant. Be (beryllium) or the like may also be doped as the p-type dopant.

An upper $n^-$-type layer (first layer) 32 is formed from the region that is part of the lower $n^-$-type layer 22 over the region that is part of the $p^+$-type layer 42. The upper $n^-$-type layer 32 is composed of AlGaN (aluminum gallium nitride, more specifically $Al_{0.3}Ga_{0.7}N$) doped with Si, which is an n-type dopant. The concentration of carriers in the upper $n^-$-type layer is about $1 \times 10^{16}$ $cm^{-3}$. The thickness of the upper $n^-$-type layer 32 is about 50 nm.

An $n^+$-type source layer 40 is formed in the location in contact with one end (left end as shown in the figure) of the upper $n^-$-type layer 32 and is located on the region that is part of the $p^+$-type layer 42. An $n^+$-type drain layer 26 is formed in the location in contact with the other end (right end as shown in the figure) of the upper $n^-$-type layer 32 and is located on the region that is part of the lower $n^-$-type layer 22. The $n^+$-type source layer 40 and the $n^+$-type drain layer 26 are composed of GaN doped with Si, which is an n-type dopant.

A source electrode 38 is formed from the region that is part of the lower $n^+$-type source layer 40 over the region that is part of the $p^+$-type layer 42. The source electrode 38 is in contact with both the $n^+$-type source layer 40 and the $p^+$-type layer 42. A drain electrode 28 is formed on the $n^+$-type drain layer 26. A gate-insulating layer 30 is formed from above the upper $n^-$-type layer 32 over the region that is part of the $n^+$-type source layer 40. The gate-insulating layer 30 is composed of AlN (aluminum nitride). The thickness of the gate-insulating layer 30 is about 50 nm. A gate electrode 34 is formed on the region that is part of the gate-insulating layer 30. The gate electrode 34 is positioned higher than the region that is part of the $p^+$-type layer 42. The upper $n^-$-type layer 32 comprises a region 32a formed between the gate electrode 34 and the $p^+$-type layer 42.

The source electrode 38 and the drain electrode 28 are formed as ohmic electrodes by using a Ti (titanium) and Al (aluminum) laminated structure. The thickness of Ti is about 10 nm. The thickness of Al is about 100 nm. The gate electrode 34 is composed of Ni (nickel). The thickness of the gate electrode 34 is about 100 nm.

The band gap of the upper n$^-$-type layer 32 is larger than the band gap of the p$^+$-type layer 42. In the present embodiment, the band gap of the upper n$^-$-type layer 32 is increased by introducing Al into the upper n$^-$-type layer 32.

A depleted layer extends on both sides of the upper n$^-$-type layer 32 and the p$^+$-type layer 42 from the contact zone (pn junction) 24 of the upper n$^-$-type layer 32 and the p$^+$-type layer 42. The thickness of the upper n$^-$-type layer 32 is not greater than the thickness of the depleted layer extending from the pn junction 24 between the upper n$^-$-type layer 32 and the p$^+$-type layer 42 to the upper n$^-$-type layer 32 when no voltage is applied to the gate electrode 34.

The operation of the first embodiment will be explained hereinbelow. As described above, the thickness of the upper n$^-$-type layer 32 is not greater than the thickness of the depleted layer extending to the upper n$^-$-type layer 32 when no voltage is applied to the gate electrode 34. Therefore, in a state in which no voltage is applied to the gate electrode 34, the entire region 32a located directly above the p$^+$type layer 42 in the upper n$^-$-type layer 32 is substantially depleted by the depleted layer extending to the upper n$^-$-type layer 32. For this reason, in a state in which no voltage is applied to the gate electrode 34, no current flows between the source electrode 38 and the drain electrode 28. Thus, the transistor executes a normally-off operation. From the standpoint of safety, it is desired that no current flows, that is, that the normally-off state is realized when no voltage is applied to the gate electrode 34 in high-power semiconductor devices. This transistor executes, as described above, the normally-off operation. Therefore this transistor is especially suitable as a semiconductor device for high-power applications.

Figure 2:
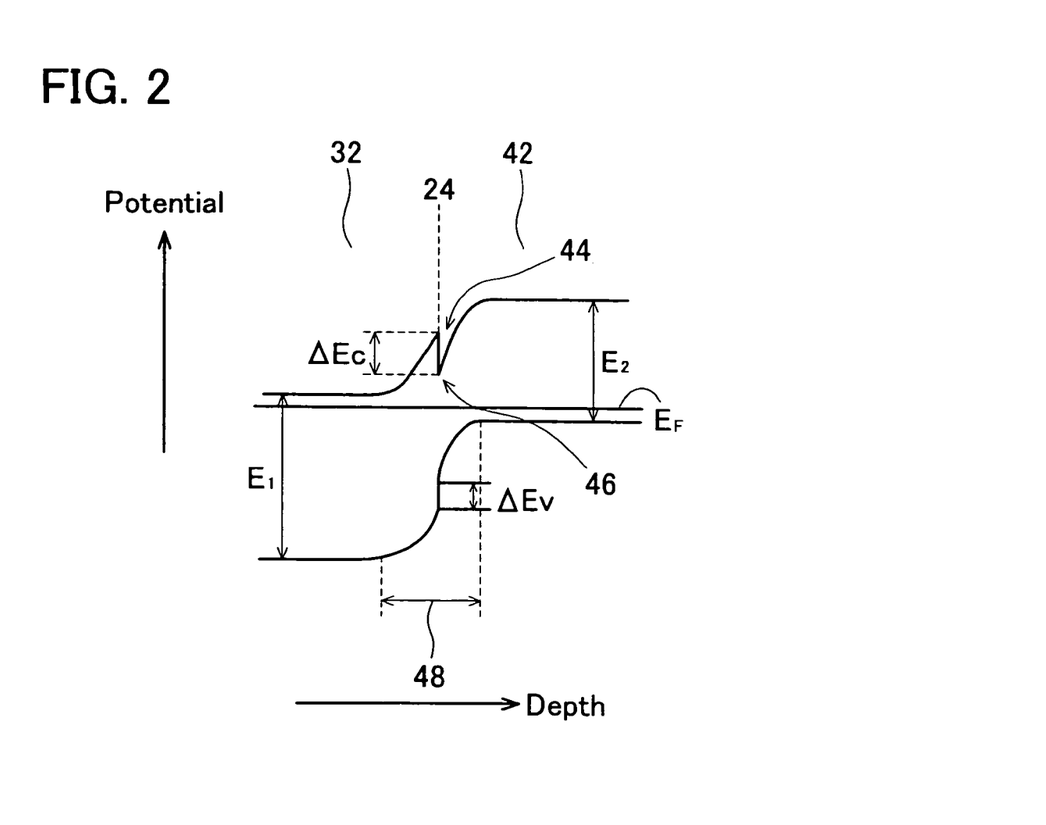
FIG. 2 is an energy band diagram of the upper $n^-$-type layer and $p^+$-type layer in the first embodiment.

FIG. 2 illustrates an energy band diagram of the upper n$^-$-type layer 32 and the p$^+$-type layer 42. The configuration of the energy band diagram shown in FIGS. 2 through 4 corresponds to the configuration of the cross-sectional view along line A—A shown in FIG. 1. As described hereinabove, the band gap $E_1$ of the upper n$^-$-type layer 32 is larger than the band gap $E_2$ of the p$^+$-type layer 42. If the upper n$^-$-type layer 32 and the p$^+$-type layer 42 are thus joined, the energy band is curved so that the Fermi levels ($E_F$) of the two are matched. As a result, a spike 44 and a notch (quantum well) 46 are formed in the energy band. Furthermore, a depleted layer 48 extends on both sides of the upper n$^-$-type layer 32 and the p$^+$-type layer 42 from the pn junction 24 between the upper n$^-$-type layer 32 and the p$^+$-type layer 42.

Figure 3:
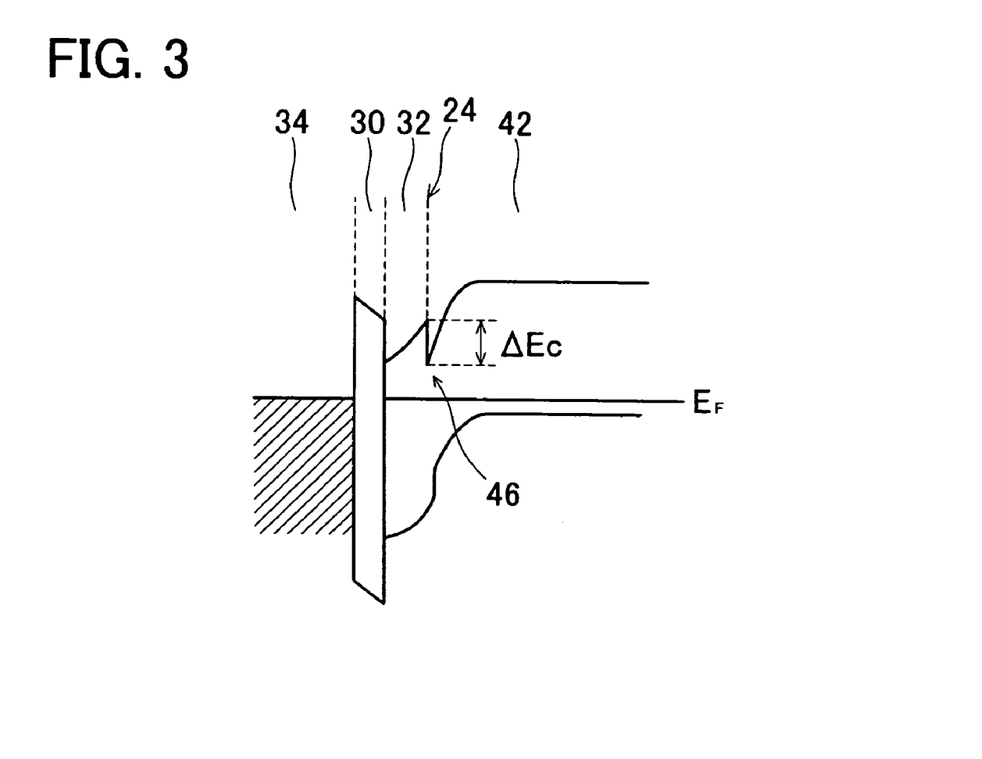
FIG. 3 is an energy band diagram illustrating a state in which no voltage is applied to the gate electrode in the first embodiment.
Figure 4:
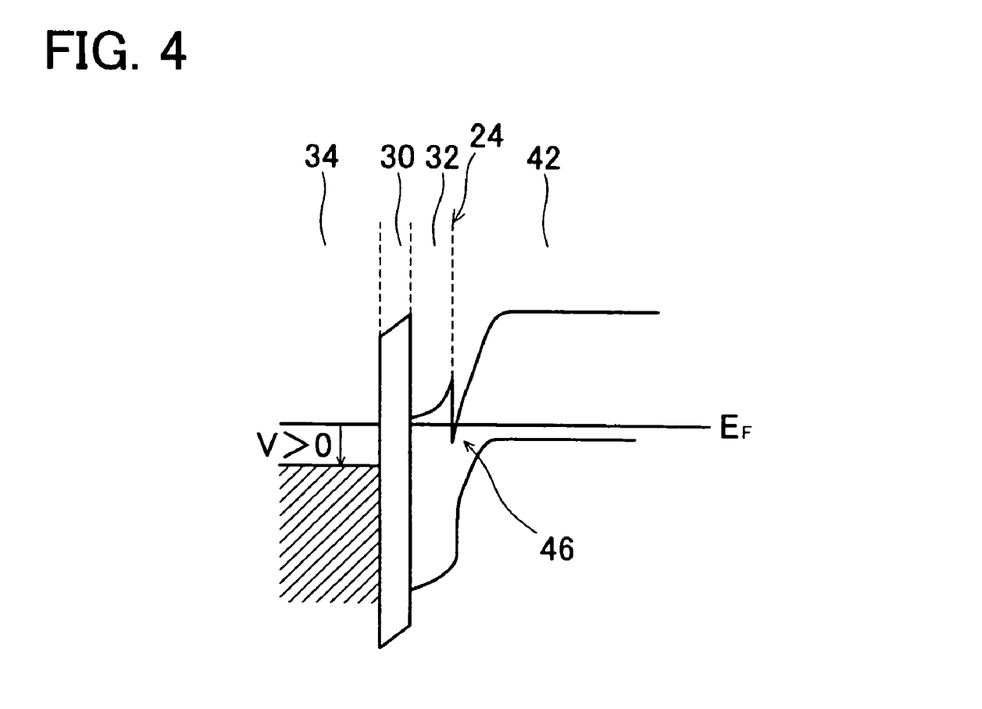
FIG. 4 is an energy band diagram illustrating a state in which a positive voltage is applied to the gate electrode in the first embodiment.

FIG. 3 shows an energy band diagram relating to a structure comprising the gate-insulating layer 30 and the gate electrode 34 in addition to the upper n$^-$-type layer 32 and the p$^+$-type layer 42. FIG. 3 represents a state in which no voltage is applied to the gate electrode 34. If a positive voltage is applied to the gate electrode 34, the energy band bends as shown in FIG. 4. As a result, the notch 46 moves below the Fermi level ($E_F$) Therefore, a channel is formed in the notch 46 and electrons flow therein.

As follows from FIG. 4, the notch 46 is formed in the vicinity of a boundary 24. Thus, a channel is formed in the vicinity of the boundary 24 (mainly in the p$^+$-type layer 42 in the vicinity of the boundary 24). The notch (channel) 46 shown in FIG. 4 extends in the direction perpendicular to the page. As shown in FIG. 1, the channel extends in the left-right direction because it is formed in the vicinity of the boundary 24 between the first layer 32 and the second layer 42.

Thus, if a positive voltage is applied to the gate electrode 34, as shown in FIG. 1, electrons flow in the transverse direction in the order as follows: source electrode 38, n$^+$-type source layer 40, channel (in the vicinity of the boundary 24 of the upper n$^-$-type layer 32 and the p$^+$-type layer 42), in the vicinity of a boundary 25 of the upper n$^-$-type layer 32 and the lower n$^-$-type layer 22, n$^+$-type drain layer 26, and drain electrode 28. Thus, the electric current flows in the transverse direction from the drain electrode 28 to the source electrode 38 and the transistor is switched on.

If the electrons flowing in the channel collide with the surrounding atoms, holes with a conductivity type inversed with respect to that of the electrons flowing in the formed channel can be formed. According to the above-described embodiment, those holes can be pulled out through the p$^+$-type layer 42 and the source electrode 38 which is in contact therewith. Therefore, accumulation of the holes in the device can be suppressed. For this reason, the occurrence of dielectric breakdown caused by the presence of accumulated holes can be prevented. Therefore, breakdown resistance of the transistor can be increased.

Furthermore, as shown in FIG. 4, the notch 46 has become a region that was two-dimensionally narrowed with respect to the three-dimensionally expanded region located above it. The electrons flow through the channel formed by this two-dimensionally narrowed notch 46. The notch 46 provides a very narrow channel. Therefore, the so-called two-dimensional electron gas is formed. For this reason, the collection degree and mobility of the electrons can be increased. As a result, channel resistance can be reduced. Therefore, the ON resistance can be decreased.

As described hereinabove, in accordance with the first embodiment, it is possible to realize a useful semiconductor device which is normally off, has a high breakdown resistance, and has a low ON resistance.

An example of the method for the fabrication of the structure of the first embodiment will be explained hereinbelow with reference to FIG. 1. First, the lower n$^-$-type layer 22 is epitaxially grown by the MOCVD method (organometallic vapor phase deposition method) on a substrate 20. Then, a first mask layer (SiO$_2$ layer) is formed on the lower n$^-$-type layer 22. An opening for forming the p$^+$-type layer 42 on the first mask layer is then formed by a photolithography process. The lower n$^-$-type layer exposed from the opening in the first mask layer is etched out by the RIE method (reactive ion etching method). The etched layer is not present in FIG. 1 because this layer has been already etched. Further, an MBE method (molecular beam epitaxy method) may be also used instead of the above-mentioned MOCVD method. The same applies hereinbelow.

The p$^+$-type layer 42 is then selectively epitaxially grown by the MOCVD method on the lower n$^-$-type layer 22 newly exposed by the etching and positioned below the etched lower n$^-$-type layer (this etched layer is not present in FIG. 1). The p$^+$-type layer 42 is grown till it reaches the height of the topmost surface of the lower n$^-$-type layer 22. The formation of the p$^+$-type layer 42 is carried out, while the previously formed first mask layer remains intact. Because the p$^+$-type layer 42 does not grow on the first mask layer, the p$^+$-type layer 42 can be selectively grown only on the lower n$^-$-type layer 22 that was newly exposed by etching. The first mask layer is then removed with an aqueous solution of HF.

The upper n⁻-type layer 32 is then epitaxially grown by the MOCVD method from above the entire p⁺-type layer 42 over the entire lower n⁻-type layer 22. The second mask layer (SiO₂ layer) is then formed over the entire upper n⁻-type layer 32. An opening for forming the source layer 40 and an opening for forming the drain layer 26 are then formed by a photolithography process in the second mask layer. Then, N (nitrogen) is implanted by an ion implantation method at a dose of 1×10⁻¹⁵ cm⁻² and an accelerating voltage of 35 keV into the openings of the second mask layer. Si is then implanted by an ion implantation method at a dose of 1×10⁻¹⁵ cm⁻² and an accelerating voltage of 65 keV into the openings of the second mask layer. As a result, the n⁺-type source layer 40 and the n⁺-type drain layer 26 (prior to activation of the ion-implanted dopant) can be formed.

A mask layer (SiO₂ layer) is then again formed in the open portion of the second mask layer. All those mask layers will be referred to hereinbelow as a third mask layer. Thus, the entire top surface of the device is covered with the third mask layer. The device is then annealed for 5 min at a temperature of 1300° C. in an N (nitrogen) atmosphere. As a result, the ion-implanted dopants are activated. An opening is then formed in the third mask layer. This opening is employed for removing the upper n⁻-type layer (this layer is not present in FIG. 1) formed on the p⁺type layer 42, which is in contact with the source electrode 38. The upper n⁻-type layer (this layer is not present in FIG. 1) exposed from the opening of the third mask layer is then etched out by the RIE method. The third mask layer is then removed with an aqueous solution of HF.

The gate-insulating layer 30 is then formed by a sputtering method on the entire top surface of the device. An opening for forming the source electrode 38 and an opening for forming the drain electrode 28 are then formed by a photolithography process on the gate-insulating layer 30. Ti and Al are then successively deposited to form a source electrode 38 on the p⁺-type layer 42 and the n⁺-type source layer 40 exposed from the openings. Further, Ti and Al are deposited to form a drain electrode 28 on the n⁺-type drain layer 26 exposed from the openings. Annealing is then conducted for 2 min at a temperature of 500° C. in an N (nitrogen) atmosphere. As a result, contact resistance of the source electrode 38 and the n⁺-type source layer 40, the source electrode 38 and the p⁺-type layer 42, and the drain electrode 28 and the n⁺type drain layer 26 is reduced. Ni is then vapor deposited to form the gate electrode 34 on the gate-insulating layer 30 positioned above the p⁺-type layer 42.

The field-effect transistor, of the first embodiment can be fabricated by the above-described process.

(Second Embodiment)

Figure 5:
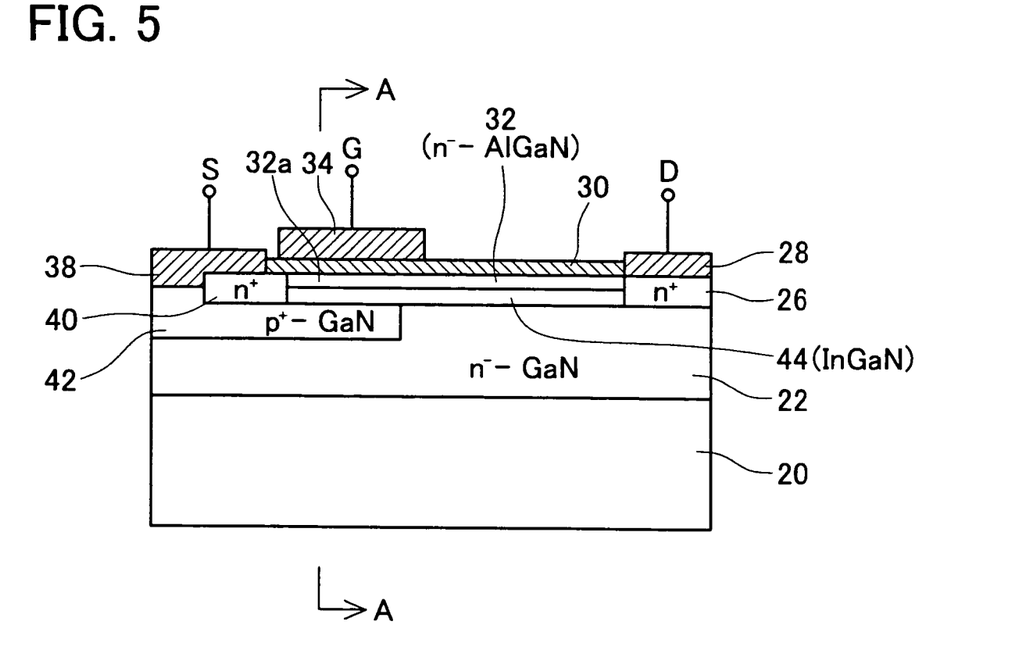
FIG. 5 is a cross-sectional view of the field-effect transistor of the second embodiment.

The field-effect transistor of the second embodiment shown in FIG. 5 is different from that of the first embodiment mainly in the aspects as follows. In the second embodiment, a channel layer (third layer) 44 is provided between the upper n⁻-type layer 32 and the p⁺-type layer 42. The channel layer 44 is also continuously provided between the upper n⁻-type layer 32 and the lower n⁻-type layer 22. The channel layer 44 is composed of true InGaN that was not doped with dopant. Indium is introduced in the channel layer 44. As a result, the band gap of the channel layer 44 is made smaller than the band gaps of the upper n⁻-type layer 32 and the p⁺-type layer 42.

In the second embodiment, the fabrication can be conducted by removing the first mask layer by virtue of a process similar to that of the first embodiment, then successively growing the channel layer 44 and the upper n⁻-type layer 32 by the MOCVD method over the entire lower n⁻-type layer 22 and p⁺-type layer 42 and then conducting operations as in the first embodiment.

Figure 6:
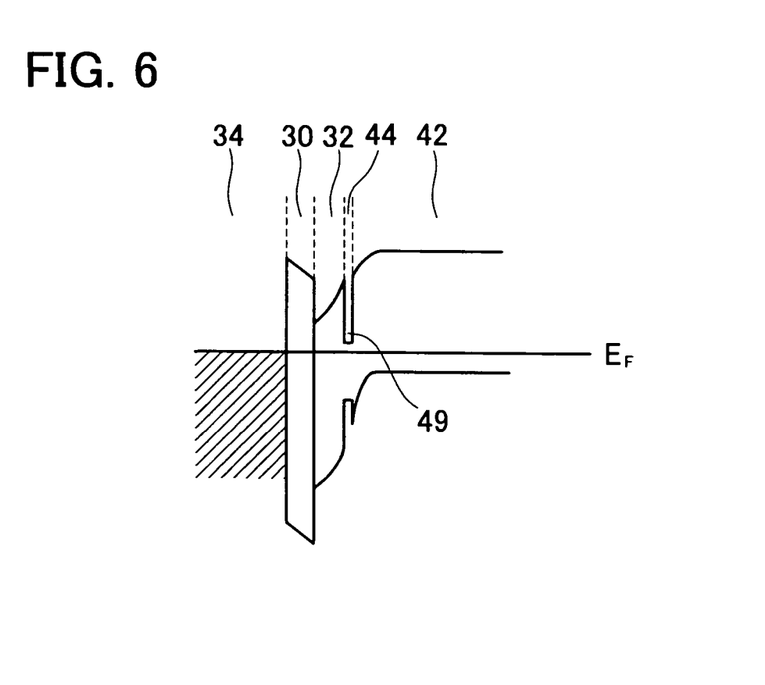
FIG. 6 is an energy band diagram illustrating a state in which no voltage is applied to the gate electrode in the second embodiment.

An energy band obtained in the case when the channel layer 44 is provided is shown in FIG. 6. If the channel layer 44 is provided, as shown in FIG. 6, a recessed portion (quantum well) 49 analogous to the notch 46 (see FIGS. 2 through 4) of the first embodiment can be formed. If such a recessed portion 49 has been formed, when a positive voltage is applied to the gate electrode 34, the lower end part of the recessed portion 49 is located lower than the Fermi level ($E_F$), similarly to the notch 46 of the first embodiment. Furthermore, a channel is formed in the lower end part (channel layer 44) of the recessed portion 49. The degree of electron collection can be increased by forming the channel by using the quantum well 49.

Further, the channel layer 44 is not doped with a dopant. Therefore, the diffusion of electrons when electrons flow in the channel layer 44 can be avoided. As a result, mobility of the electrons can be further increased. For this reason, the channel resistance can be further decreased. Therefore, the ON resistance can be further decreased.

(Third Embodiment)

Figure 7:
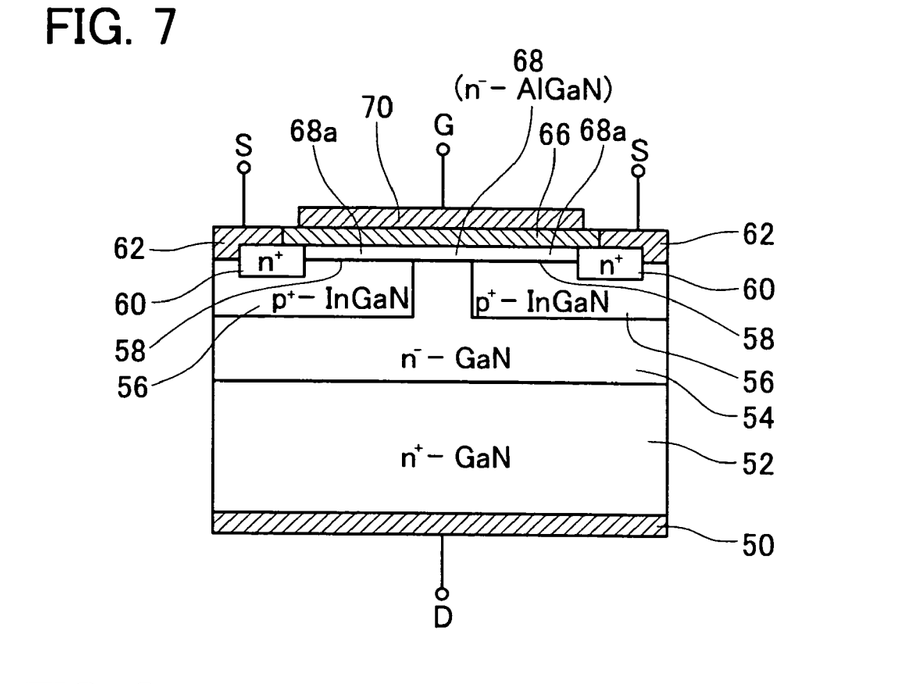
FIG. 7 is a cross-sectional view of the field-effect transistor of the third embodiment.

The field-effect transistor of the third embodiment shown in FIG. 7 has a left-right symmetrical structure of a longitudinal transistor in which a source electrode is formed on the front surface (first surface) of the device and a drain electrode is formed on the rear surface (second surface) of the device. A lower n⁻-type layer (part of the fourth layer) 54 is formed on an n⁺-type drain layer (part of the fourth layer) 52. The n⁺-type drain layer 52 and the lower n⁻-type layer 54 are composed of GaN that was doped with Si as an n-type dopant. However, the n⁺-type drain layer 52 was doped with Si to a higher concentration than the lower n⁻-type layer 54. The concentration of carriers in the n⁺-type drain layer 52 is about 3×10¹⁸ cm⁻³. The concentration of carriers in the lower n⁻-type layer 54 is about 1×10¹⁶ cm⁻³. The thickness of the n⁺-type drain layer 52 is about 200 μm. The thickness of the thickest portion of the lower n⁻-type layer 54 is about 6 μm. A drain electrode 50 is formed on the bottom surface of the n⁺-type drain layer 52.

Further, p⁺-type layers (second layers) 56 are formed on the left side portion and right side portion of the lower n⁻-type layer 54. Those p⁺-type layers 56 are composed of InGaN doped with Mg as a p-type dopant. The concentration of carriers in the p⁺-type layers 56 is about 1×10¹⁸ cm⁻³. Further, a pair of n⁺-type source layers 60 is formed on regions that are parts of those p⁺-type layers 56. Those n⁺-type source layers 60 are composed of GaN doped with Si, which is an n-type dopant. A pair of source electrode 62 is formed on the region that is part of the p⁺-type layers 56 and a region that is part of the n⁺-type source layers 60. Each source electrode 62 is in contact with both the p⁺-type layer 56 and the n⁺-type source layer 60.

An upper n⁻-type layer (first layer) 68 is formed on the right side portion of the left p⁺-type layer 56, on the central portion of the lower n⁻-type layer 54, and on the left side portion of the right p⁺-type layer 56. The upper n⁻-type layer 68 is composed of AlGaN (more specifically, Al₀.₃Ga₀.₇N) doped with Si, as an n-type dopant. The concentration of carriers in the upper n⁻-type layer 68 is about 1×10¹⁶ cm⁻³. The thickness of the upper n⁻-type layer 68 is about 50 nm. A gate-insulating layer 66 is formed on the right side portion of the left n⁺-type source layer 60, on the upper n⁻-type layer 68, and on the left side portion of the right n+-type source layer 60. A gate electrode 70 is formed on the gate-insulating layer 66.

The upper n−-type layer 68 has a pair of regions 68a formed between the gate electrode 70 and the p+-type layer 56. The structural materials and thickness of the gate insulating layer 66 and electrodes 50, 62, and 70 are identical to those of the first embodiment.

The band gap of the upper n−-type layer 68 is larger than the band gap of the p+-type layer 56. In the present embodiment, the band gap of the upper n−-type layer 68 is made larger than the band gap of the p+-type layer 56 by introducing Al into the upper n−-type layer 68 and introducing In into the p+-type layer 56.

Depleted layers extend to both sides of the upper n−-type layer 68 and the p+-type layer 56 from the contact portion (pn junction) between the upper n−-type layer 68 and the p+-type layer 56. The thickness of the upper n−-type layer 68 is not more than the thickness of the depleted layer extending from the pn junction 58 to the upper n−-type layer 68 when no voltage is applied to the gate electrode 70.

The operation of the third embodiment will be described hereinbelow. When no voltage is applied to the gate electrode 70, the entire region 68a located directly above the p+-type layer 56 within the upper n−-type layer 68 is substantially depleted by the depleted layer extending from the pn junction 58 to the upper n−-type layer 68, similarly to the first embodiment. As a result, when no voltage is applied to the gate electrode 70, no electric current flows between the source electrode 62 and the drain electrode 50. The transistor thus executes a normally off operation.

If a positive voltage is applied to the gate electrode 70, the electrons first flow in the transverse direction in the order as follows: source electrode 62, n+-type source layer 60, and channel (close to the boundary 58 between the upper n−-type layer 68 and the p+-type layer 56). The electrons then flow in the longitudinal direction in the order as follows: lower n−-type layer 54, n+-type drain layer 52, and drain electrode 50. Thus, the electric current flows from the drain electrode 50 to the source electrodes 62 and the transistor is switched ON.

With the third embodiment, similarly to the first embodiment, a useful semiconductor device can be realized which is normally off and has a high breakdown voltage and a low ON resistance.

An example of a method for the fabrication of the third embodiment will be described below with reference to FIG. 7. First, the lower n−-type layer 54 is grown by the MOCVD method on the n+-type drain layer 52. A first mask layer (SiO$_2$ layer) is then formed on the lower n−-type layer 54. Opening for forming the p+-type layers 56 are then formed by a photolithography process in the first mask layer. The lower n−-type layer exposed from the openings of the first mask layer is then etched out by the RIE method (this etched layer is not shown in FIG. 7).

The pair of p+-type layers 56 is then selectively grown by the MOCVD method on the lower n−-type layer 54, which was located below the etched lower n−-type layer (this layer is not shown in FIG. 7) and was newly exposed by etching. The pair of p+-type layers 56 is grown till it reaches the height of the topmost surface of the lower n−-type layer 54. The formation of the p+-type layers 56 is carried out, while the previously formed first mask layer remains intact. The first mask layer is then removed with an aqueous solution of HF.

The upper n−-type layer 68 is then grown by the MOCVD method from above the entire p+-type layers 56 over the entire lower n−-type layer 54. A second mask layer (SiO$_2$ layer) is then formed over the entire upper n−-type layer 68. Openings for forming the pair of source layers 60 are then formed by a photolithography process in the second mask layer. Then, N (nitrogen) is implanted by an ion implantation method at a dose of $1\times10^{-15}$ cm$^{-2}$ and an accelerating voltage of 35 keV into the openings of the second mask layer. Si is then implanted by an ion implantation method at a dose of $1\times10^{-15}$ cm$^{-2}$ and an accelerating voltage of 65 keV into the openings of the second mask layer. As a result, the pair of n+-type source layer 40 (prior to activation of the ion-implanted dopant) are formed.

A mask layer (SiO$_2$ layer) is then again formed in the openings of the second mask layer. All those mask layers will be referred to hereinbelow as a third mask layer. Thus, the entire top surface of the device is covered with the third mask layer. The device is then annealed for 5 minutes at a temperature of 1300° C. in an N (nitrogen) atmosphere. A pair of openings is then formed in the third mask layer. The openings are employed for removing the upper n−-type layers (this layer is not present in FIG. 7) formed on the p+-type layers 56, which is in contact with the source electrode 62. The upper n−-type layers exposed from the openings of the third mask layer are then etched out by the RIE method (the etched layer are not present in FIG. 7). The third mask layer is then removed with an aqueous solution of HF.

The gate-insulating layer 66 is then formed by a sputtering method on the entire top surface of the device. The openings for forming the pair of source electrodes 62 are then formed by a photolithography process in the gate-insulating layer 66. Ti and Al are then successively vapor deposited to form the pair of source electrodes 62 on the p+-type layers 56 and n+-type source layers 60 exposed from the openings. Further, Ti and Al are then successively vapor deposited to form a drain electrode 50 on the bottom surface of the n+-type drain layer 52. Annealing is then conducted for 2 min at a temperature of 500° C. in an N (nitrogen) atmosphere. Ni is then vapor deposited to form the gate electrode 70 on the gate-insulating layer 66 positioned above the p+-type layer 56.

The field-effect transistor, of the third embodiment, can be fabricated by the above-described process.

(Fourth Embodiment)

Figure 8:
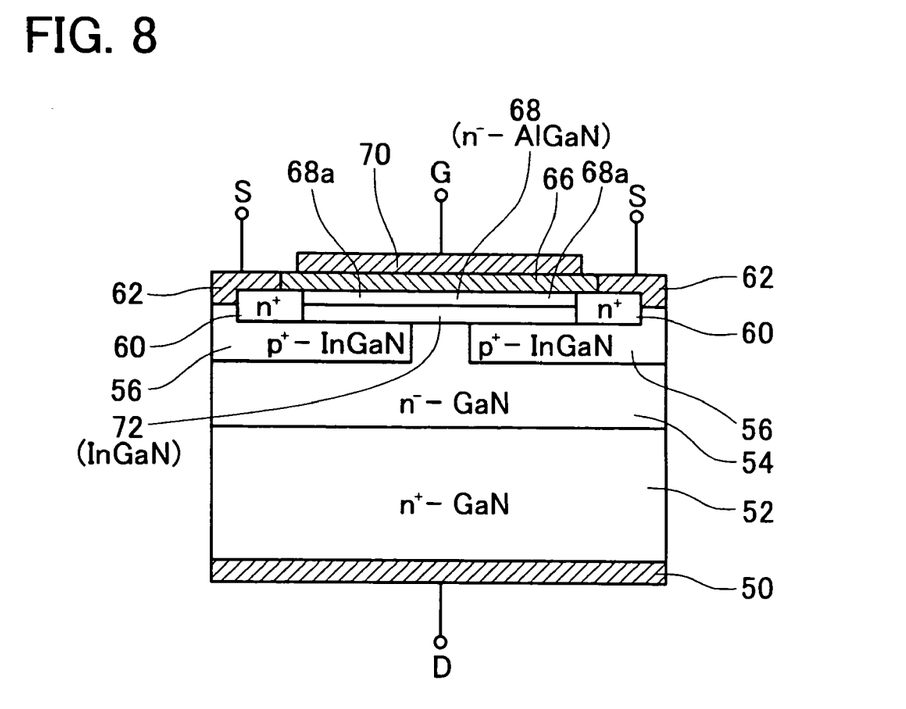
FIG. 8 is a cross-sectional view of the field-effect transistor of the fourth embodiment.

The field-effect transistor of the fourth embodiment shown in FIG. 8 is different from that of the third embodiment mainly in the aspects as follows. In the fourth embodiment, a channel layer (third layer) 72 is provided between the upper n−-type layer 68 and the p+-type layer 56. The channel layer 72 is also continuously provided between the upper n−-type layer 68 and the lower n−-type layer 54. The channel layer 72 is composed of true InGaN that was not doped with dopant. Indium is introduced in the channel layer 72. As a result, the band gap of the channel layer 72 is reduced with respect to the band gap of the upper n−-type layer 68 and the p+-type layer 56.

In the fourth embodiment, the fabrication can be conducted by removing the first mask layer by virtue of a process similar to that of the third embodiment, then successively growing the channel layer 72 and the upper n−-type layer 68 by the MOCVD method over the entire lower n+-type layer 54 and p+-type layers 56 and then conducting operations as in the third embodiment.

(Fifth Embodiment)

Figure 9:
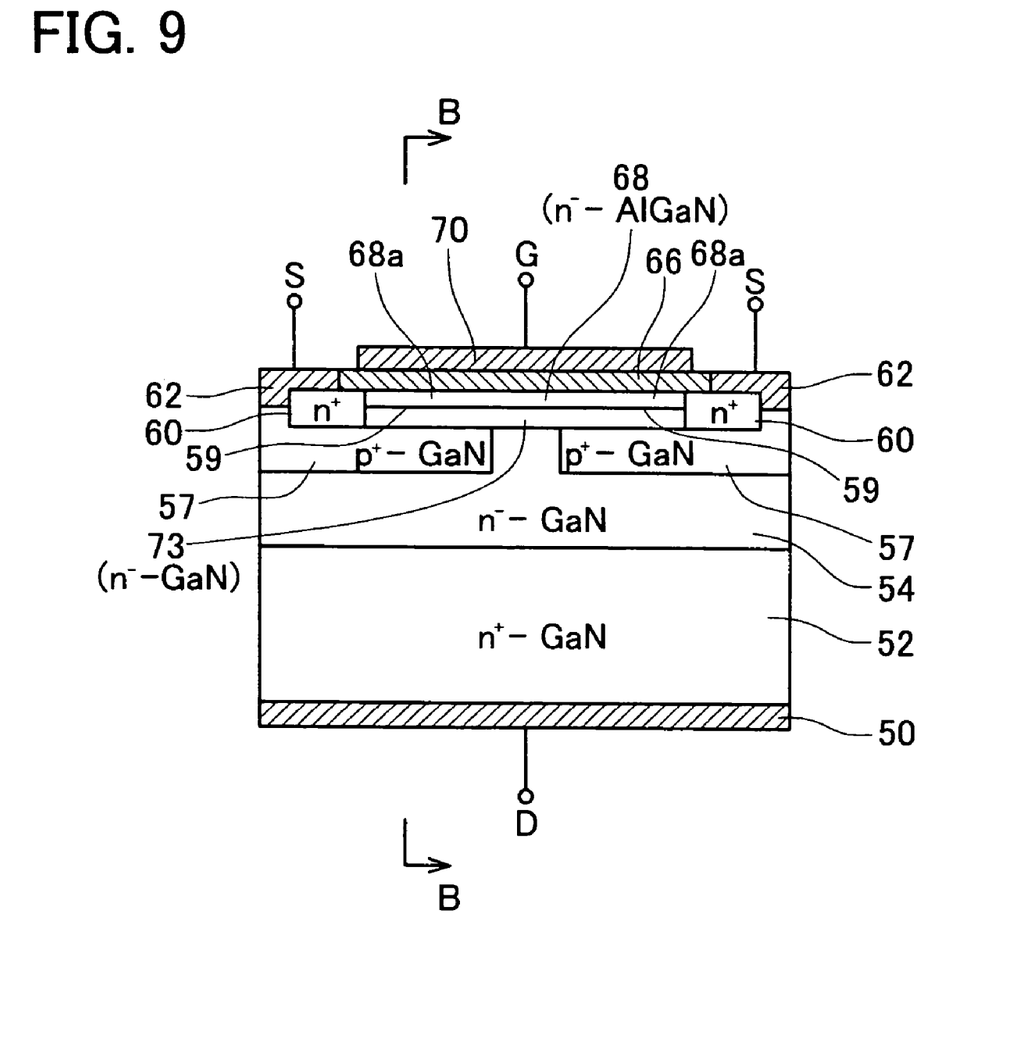
FIG. 9 is a cross-sectional view of the field-effect transistor of the fifth embodiment.

The field-effect transistor of the fifth embodiment shown in FIG. 9 is different from that of the fourth embodiment mainly in the aspects as follows. The channel layer 72 of the fourth embodiment was composed of true InGaN that was not doped with dopant, whereas the channel layer 73 of the fifth embodiment is composed of n⁻-type GaN that was doped with Si as an n-type dopant. The concentration of dopant in this channel layer 73 is $1 \times 10^{16}$ cm$^{-3}$. Further, the p⁺-type layer 56 of the fourth embodiment was composed of InGaN doped with Mg as a p-type dopant, whereas in the fifth embodiment it was composed of p⁺-type GaN containing no In. The concentration of dopant in the p⁺-type layer 57 is $5 \times 10^{17}$ cm$^{-3}$. Therefore, the band gap of the channel layer 73 of the fifth embodiment is equal to that of the p⁺-type layer 57 and is less than that of the upper n-type layer 68.

Figure 10:
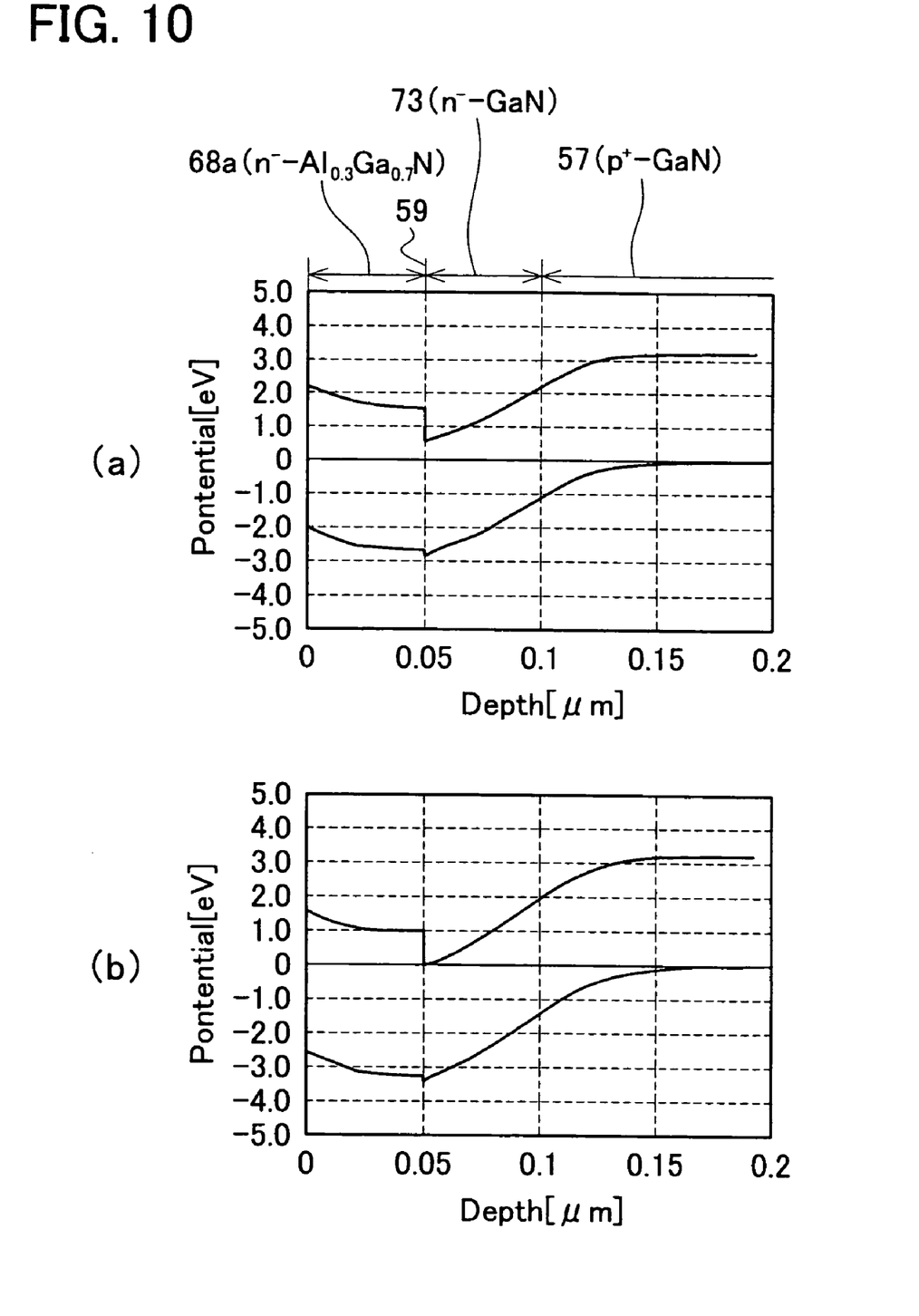
FIG. 10(a) is an energy band diagram illustrating a state in which no voltage is applied to the gate electrode of the fifth embodiment.
FIG. 10(b) is an energy band diagram illustrating a state in which a positive voltage is applied to the gate electrode of the fifth embodiment.

FIG. 10 is an energy band diagram corresponding to section B—B in FIG. 9. The depth obtained when the boundary between the upper n⁻-type layer 68a and the gate insulating layer 66 is at a 0 position is plotted against the abscissa, and a potential energy in each position is plotted against the ordinate. FIG. 10(a) illustrates a state in which no voltage is applied to the gate electrode 70, and FIG. 10(b) illustrates a state in which a voltage of 3.0 V is applied to the gate electrode 70.

Referring to FIG. 10(a), a notch (quantum well) was formed in the boundary 59 of the upper n⁻-type layer 68a and the channel layer 73 due to the difference in the band energy therebetween. In the case of the present embodiment, a concave notch surrounded by energy barriers is not formed because the band gaps of the channel layer 73 and p⁺-type layer 57 coincide. The notch is formed within the channel layer 73 at the side of the boundary 59 between the upper n⁻-type layer 68a and the channel layer 73. When no voltage is applied to the gate electrode 70, the potential of this notch is located above the Fermi level (0 eV). As a result, the channel is not formed and the electrons do not flow. Therefore, a field-effect transistor that is normally off can be realized.

On the other hand, if a positive voltage is applied to the gate electrode 70, the potential of the notch reaches the Fermi level (0 eV), as shown in FIG. 10(b). Therefore, the channel is formed in the notch and electrons flow therein. The channel is formed within the channel layer 73 at the side of the boundary 59.

In the above-described field-effect transistor, the notch serving as the channel is formed within the channel layer 73 with a low concentration of dopants. Therefore, the diffusion of electrons occurring when electrons flow in the channel layer 73 can be avoided. As a result, mobility of the electrons can be further increased. For this reason, the channel resistance can be further decreased. Therefore, the ON resistance can be further decreased.

In the above-described transistor, the gate voltage necessary for the potential of the notch to reach the Fermi level is as low as 3.0 V.

Further, the technology of the present embodiment may be also applied to the field-effect transistor of the second embodiment. Thus, the channel layer 44 of the second embodiment shown in FIG. 5 is composed of n⁻-type GaN doped with an n-type dopant. A field-effect transistor with a low ON resistance can be realized by the same operation effect as that of the fifth embodiment.

(Sixth Embodiment)

Figure 11:
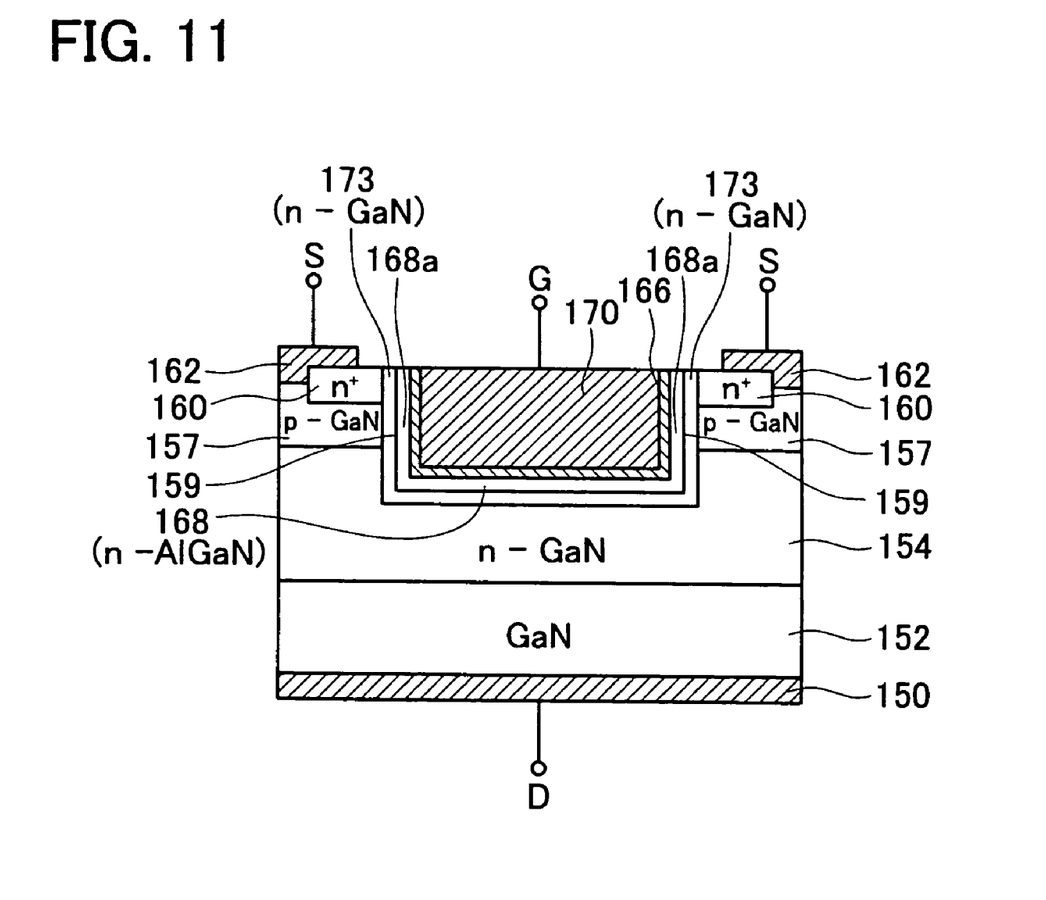
FIG. 11 is a cross-sectional view of the field-effect transistor of the sixth embodiment.

The field-effect transistor of the sixth embodiment shown in FIG. 11 comprises a trench-type gate electrode 170 extending in the direction perpendicular to a surface of the semiconductor device.

A lower n-type layer (part of the fourth layer) 154 is formed on a drain layer (part of the fourth layer) 152. A GaN substrate is used for the drain layer 152. The lower n-type layer 154 is composed of GaN doped with Si as an n-type dopant. A drain electrode 150 is formed on the rear surface of the drain layer 152.

Further, p-type layers (second layers) 157 are formed above the left side portion and right side portion of the lower n-type layer 154. Those p-type layers 157 are composed of GaN doped with Mg as a p-type dopant. Further, n⁺-type source layers 160 are formed on the regions that are parts of those p-type layers 157. Those n⁺-type source layers 160 are composed of GaN doped with Si, which is an n-type dopant. The n⁺-type source layers 160 are separated from the lower n-type layer 154 by the p-type layer 157. A source electrode 162 is formed on the region that is part of the p-type layer 157 and up to the region that is part of the n-type source layer 160. Each source electrode 162 is in contact with both the p-type layer 157 and the n⁺-type source layer 160.

A trench is formed through the n⁺-type source layer 160 and the p-type layer 157, and a channel layer 173, upper n-type layer 168, gate insulating layer 166, and gate electrode 170 are formed inwardly from the side wall side of the trench.

The channel layer 173 is composed of n-type GaN doped with Si as an n-type dopant. The upper n-type layer 168 is composed of AlGaN (more specifically, $Al_{0.3}Ga_{0.7}N$) doped with Si as an n-type dopant. The zone of the upper n-type layer 168, which faces the p-type layer 157, is called an upper n-type layer 168a and is distinguished for the sake of convenience.

Constituent materials of the gate insulating layer 166 and electrodes 150, 162, and 170 are identical to those of the fifth embodiment.

The band gap of the channel layer 173 is equal to that of the p-type layer 157 and is less than that of the upper n-type layer 168.

Because of the difference in the band gap between the upper n-type layer 168a and the channel layer 173, a notch (quantum well) is formed in the boundary 159 thereof. In the case of the present embodiment, because the band gaps of the channel layer 173 and the p-type layer 157 coincide, the concave notch surrounded by an energy barrier is not formed. In the vicinity of the boundary 159 of the upper n-type layer 168 and the channel layer 173, the notch is formed at the side of the channel layer 173. When no voltage is applied to the gate electrode 170, the potential of this notch is above the Fermi level. Therefore, the channel is not formed and electrons do not flow. Therefore, the field-effect transistor realizes a normally off action.

On the other hand, if a positive voltage is applied to the gate electrode 170, the potential of the notch reaches the Fermi level. Therefore, a channel is formed in the notch and electrons flow therethrough.

In the above-described field-effect transistor, if the semiconductor device is switched ON, the electrons supplied from the n⁺-type source layer 160 flow in the longitudinal direction along the channel layer 173. In other words, the electrons flow along the side surface of the trench-type gate electrode 170 in the direction perpendicular to the main surface of the semiconductor substrate and then flow to the drain electrode 150 via the lower n-type layer 154 and drain layer 152.

In the field-effect transistor of the sixth embodiment, employing the trench-type gate electrode 170 makes it possible to form a channel in the direction perpendicular to the main surface of the semiconductor substrate. The surface area of the field-effect transistor can be decreased. Furthermore, because a wide channel can be ensured, the channel resistance can be decreased and, therefore, ON resistance can be decreased.

The channel layer of the present embodiment may be also composed of a true InGaN that is not doped with a dopant. In this case, the concave notch (quantum well) is formed in the channel layer. The same operation effect can be demonstrated, the ON resistance can be decreased, and the surface area of the field-effect transistor can be decreased.

An example of the fabrication of the field-effect transistor of the sixth embodiment will be briefly described below.

First, the lower n-type layer 154, p-type layer 157, and n$^+$-type source layer 160 are grown by the MOCVD method on the GaN substrate 152, and then a trench passing through to the n-type layer 154 is formed by the RIE method. The channel layer 173 and the upper n-type layer 168 are then grown to the prescribed thickness inside this trench by the MOCVD method. The gate-insulating layer 166 is then formed to the prescribed thickness by sputtering. The gate electrode 170 is then formed by growing poly-silicon, or the like, inside the remaining portion of the trench. Other fabrication steps can be identical to those of the above-described embodiments.

Specific examples of the present invention are described above in detail, but those examples are merely illustrative and place no limitation on the patent claims. The technology described in the patent claims also includes the following changes and modifications of the above-described specific examples.

(1) In the first embodiment illustrated by FIG. 1, a structure was obtained in which the channel was mainly formed in the vicinity of the boundary 24 of the upper n$^-$-type layer 32 and the p$^+$-type layer 42. However, a structure may be also used in which the channel is mainly formed inside the upper n$^-$-type layer 32.

(2) In the above-described embodiments, a normally-off semiconductor device was explained. However, the present invention is also applicable to normally-on semiconductor devices.

(3) In the above-described embodiments, a gate insulating film was introduced between the gate electrode and the first layer. However, the two may be instead brought into Schottky contact. If the gate insulating film is introduced, a high voltage can be applied to the gate electrode and a large-current ON/OFF is possible.

(4) A method in which the p$^+$-type layer 42 is formed by a process comprising the steps of growing the lower n$^-$-type layer 22 on the substrate 20, etching out part of the lower n$^-$-type layer 22, re-growing the p$^+$-type layer 42 on the lower n$^-$-type layer 22 that was exposed by the etching process was explained hereinabove as the fabrication method of the first embodiment illustrated by FIG. 1. However, the p$^+$-type layer 42 can be also formed by ion implantation of Mg or Be into the lower n$^-$-type layer 22. In such a case, the steps of etching the lower n$^-$-type layer 22 and regrowing the p$^+$-type layer 42 can be omitted. Therefore, the fabrication process can be simplified.

(5) In the third embodiment illustrated by FIG. 7, it is also possible to grow a thin lower n$^-$-type layer 54, to grow the p$^+$-type layer 56 over the entire lower n$^-$-type layer 54, and to form the central portion of the n$^-$-type layer 54 by ion implantation of Si or Ge into the central portion of the p$^+$-type layer 56 (this layer is not present in FIG. 7). In this case, too, it is possible to form two p$^+$-type layers and the n$^-$-type layer 54 located therebetween.

Furthermore, the technological features explained in the specification or appended drawings demonstrate their technological utility when used alone or in a variety of combinations thereof and are not limited to the combinations described in the patent claims at the time of filing of the application. Furthermore, the technology illustrated by the specification or appended drawings can attain multiple objects at the same time, and attaining one of those objects has by itself a technological utility.

The invention claimed is:

1. A semiconductor device comprising:
   a first layer comprising a group III nitride semiconductor,
   a second layer comprising a group III nitride semiconductor, and
   a gate electrode,
   wherein the first layer is provided between the gate electrode and the second layer;
   wherein a channel is formed in at least one of: (1) the first layer, (2) the second layer, (3) the region between the first layer and the second layer when electric voltage is applied to the gate electrode;
   wherein the conductivity type of the second layer is inversed with respect to the conductivity type of majority carriers that flow in the channel, and
   wherein the first layer has a thickness dimension so that a depleted layer developed from the second layer when no electric voltage is applied to the gate electrode expands up to a surface of the first layer at a side where the gate electrode is located.

2. The semiconductor device as described in claim 1, further comprising:
   an electrode being in contact with the first layer and the second layer,
   wherein the electrode leads out carriers having the same conductivity type as the second layer from the channel via the second layer.

3. The semiconductor device of claim 1,
   wherein the first layer has a first conductivity type,
   wherein the second layer has a second conductivity type,
   wherein the first layer and the second layer are in contact with each other,
   wherein the first layer and the second layer have band gaps, and
   wherein the band gap of the first layer is larger than the band gap of the second layer.

4. The semiconductor device as described in claim 1, further comprising:
   a gate insulating film disposed between the gate electrode and the first layer.

5. The semiconductor device as described in claim 1, wherein
   a plurality of the second layers is formed to leave a gap between adjacent second layers, and
   the channel is formed at the gap.

6. The semiconductor device as described in claim 5, further comprising
   a fourth semiconductor layer comprising a group III nitride semiconductor, a part of the fourth semiconductor layer being formed at the gap, and
   a second electrode being in contact with the fourth layer at a side opposite to the gate electrode.

7. A semiconductor device comprising:
   a first layer comprising a group III nitride semiconductor of a first conductivity type,
   a second layer comprising a group III nitride semiconductor of a second conductivity type, a third layer comprising a group III nitride semiconductor of the first conductivity type, and a gate electrode, wherein the first layer is provided between the gate electrode and the third layer;

wherein the third layer is provided between the first layer and the second layer;

wherein the band gap of the third layer is less than the band gap of the first layer; and wherein the first layer and the third layer have the thickness dimension so that a depleted layer developed from the second layer when no electric voltage is applied to the gate electrode expands up to a surface of the first layer at a side where the gate electrode is located.

8. A semiconductor device comprising:

a first layer comprising a group III nitride semiconductor of a first conductivity type, a second layer comprising a group III nitride semiconductor of a second conductivity type, a third layer comprising a group III nitride semiconductor, and a gate electrode, wherein the first layer is provided between the gate electrode and the third layer;

wherein the third layer is provided between the first layer and the second layer;

wherein the band gap of the third layer is less than the band gap of the first layer and the second layer, and wherein the first layer and the third layer have the thickness dimension so that a depleted layer developed from the second layer when no electric voltage is applied to the gate electrode expands up to a surface of the first layer at a side where the gate electrode is located.

9. The semiconductor device as described in claim 8, wherein the third layer comprises a substantially true group III nitride semiconductor.

10. A field-effect transistor comprising:

a gate electrode;

a first layer comprising a group III nitride semiconductor of a first conductivity type;

a second layer comprising a group III nitride semiconductor of a second conductivity type located on a side of the first layer opposite to the gate electrode, a third layer located between the first layer and the second layer; and an electrode being in contact with the first layer and the second layer, wherein the third layer has a band gap smaller than the band gaps of the first layer and the second layer.

11. The field-effect transistor as described in claim 10, wherein the third layer comprises a true group III nitride semiconductor.

12. The field-effect transistor as described in claim 10, wherein the first layer and the third layer have the thickness dimension so that a depleted layer developed from the second layer when no electric voltage is applied to the gate electrode expands up to a surface of the first layer at a side where the gate electrode is located.

13. The field-effect transistor as described in claim 12, further comprising:

a gate insulating film disposed between the gate electrode and the first layer.

14. The field-effect transistor as described in claim 10, wherein a plurality of the second layers is formed to leave a gap between adjacent second layers, and a channel is formed at the gap.

15. The field-effect transistor as described in claim 14, further comprising a fourth semiconductor layer comprising a group III nitride semiconductor, a part of the fourth semiconductor layer being formed at the gap, and a second electrode being in contact with the fourth layer at a side opposite to the gate electrode.

16. A field-effect transistor comprising:

a gate electrode;

a first layer comprising a group III nitride semiconductor of a first conductivity type;

a second layer comprising a group III nitride semiconductor of a second conductivity type located on a side of the first layer opposite to the gate electrode, a third layer located between the first layer and the second layer; and an electrode being in contact with the first layer and the second layer, wherein the third layer comprises a group III nitride semiconductor of the first conductivity type and has a band gap smaller than the band gap of the first layer.

17. The field-effect transistor as described in claim 16, wherein the first layer and the third layer have the thickness dimension so that a depleted layer developed from the second layer when no electric voltage is applied to the gate electrode expands up to a surface of the first layer at a side where the gate electrode is located.

18. The field-effect transistor as described in claim 17, further comprising:

a gate insulating film disposed between the gate electrode and the first layer.

19. The field-effect transistor as described in claim 16, wherein a plurality of the second layers is formed to leave a gap between adjacent second layers, and a channel is formed at the gap.

20. The field-effect transistor as described in claim 19, further comprising a fourth semiconductor layer comprising a group III nitride semiconductor, a part of the fourth semiconductor layer being formed at the gap, and a second electrode being in contact with the fourth layer at a side opposite to the gate electrode.

21. A field-effect transistor comprising:

a gate electrode;

a first layer comprising a group III nitride semiconductor of a first conductivity type; and a second layer comprising a group III nitride semiconductor of a second conductivity type located on a side of the first layer opposite to the gate electrode, wherein the first layer has a thickness dimension so that a depleted layer developed from the second layer when no electric voltage is applied to the gate electrode expands up to a surface of the first layer at a side where the gate electrode is located.

22. The field-effect transistor as described in claim 21, further comprising:

a gate insulating film disposed between the gate electrode and the first layer.

* * * * *